US011114417B2

(12) United States Patent
Lin

(10) Patent No.: US 11,114,417 B2
(45) Date of Patent: Sep. 7, 2021

(54) THROUGH-SILICON VIA (TSV) TEST CIRCUIT, TSV TEST METHOD AND INTEGRATED CIRCUITS (IC) CHIP

(71) Applicant: Changxin Memory Technologies, Inc., Anhui (CN)

(72) Inventor: You-Hsien Lin, Hefei (CN)

(73) Assignee: Changxin Memory Technologies, Inc., Anhui (CN)

( * ) Notice: Subject to any disclaimer, the term of this patent is extended or adjusted under 35 U.S.C. 154(b) by 0 days.

(21) Appl. No.: 16/950,020

(22) Filed: Nov. 17, 2020

(65) Prior Publication Data

US 2021/0074680 A1    Mar. 11, 2021

Related U.S. Application Data

(63) Continuation of application No. PCT/CN2019/101884, filed on Aug. 22, 2019.

(30) Foreign Application Priority Data

Sep. 5, 2018 (CN) .......................... 201811030375.7
Sep. 5, 2018 (CN) .......................... 201821451279.5

(51) Int. Cl.
*H01L 25/065* (2006.01)
*H01L 23/48* (2006.01)
(Continued)

(52) U.S. Cl.
CPC ...... *H01L 25/0657* (2013.01); *G01R 31/2853* (2013.01); *H01L 22/34* (2013.01);
(Continued)

(58) Field of Classification Search
None
See application file for complete search history.

(56) References Cited

U.S. PATENT DOCUMENTS 9,177,940 B2 *  11/2015  Lung ................... H01L 25/0657
2016/0013799 A1 *  1/2016  Li ........................ H01L 23/481
                                                                327/115
(Continued)

FOREIGN PATENT DOCUMENTS

CN          102957422 A       3/2013
CN          104134650 A      11/2014
(Continued)

OTHER PUBLICATIONS

PCT International Search Report and the Written Opinion dated Nov. 21, 2019, issued in related International Application No. PCT/CN2019/101884 (8 pages).

*Primary Examiner* — Jermele M Hollington
(74) *Attorney, Agent, or Firm* — Sheppard Mullin Richter & Hampton LLP

(57) ABSTRACT

An integrated circuit (IC) with a TSV test circuit, a TSV test method are provided, pertaining to IC technologies. The IC may include a first TSV, a second TSV and a phase detector. A first end of the first TSV may be coupled to a predetermined signal output, and a second end of the first TSV may be coupled to a first end of the second TSV. A second end of the second TSV may be coupled to a first input of the phase detector, and a second input of the phase detector may be coupled to the predetermined signal output. The phase detector may be configured to determine a phase difference between signals at the first and the second inputs. In this IC, a defective TSV can be identified and segregated with a redundant TSV. This IC facilitates efficient fault correction and signal routing in the IC.

13 Claims, 5 Drawing Sheets

(51) Int. Cl.
*H01L 21/66* (2006.01)
*G01R 31/28* (2006.01)

(52) U.S. Cl.
CPC .. *H01L 23/481* (2013.01); *H01L 2225/06541* (2013.01); *H01L 2225/06596* (2013.01)

(56) References Cited

U.S. PATENT DOCUMENTS

| | | | |
|---|---|---|---|
| 2016/0258996 A1 | 9/2016 | Lim et al. | |
| 2017/0012629 A1* | 1/2017 | Yoshimi | H03L 7/00 |
| 2020/0143853 A1* | 5/2020 | Navaratnam | G11C 7/1066 |

FOREIGN PATENT DOCUMENTS

| | | | |
|---|---|---|---|
| CN | 104795342 A | 7/2015 | |
| CN | 104900644 A | 9/2015 | |
| CN | 106888008 A | 6/2017 | |
| CN | 109037193 A | 12/2018 | |
| CN | 208767296 U | 4/2019 | |

* cited by examiner

THROUGH-SILICON VIA (TSV) TEST CIRCUIT, TSV TEST METHOD AND INTEGRATED CIRCUITS (IC) CHIP

CROSS-REFERENCE TO RELATED APPLICATION

This application is a continuation application of International Patent Application No. PCT/CN2019/101884, filed on Aug. 22, 2019, which is based on and claims priority of the Chinese Patent Application No. 201811030375.7, filed on Sep. 5, 2018 and entitled "THROUGH-SILICON VIA (TSV) TEST CIRCUIT, TSV TEST METHOD AND INTEGRATED CIRCUITS (IC) CHIP." The above-referenced application is incorporated herein by reference in its entirety.

TECHNICAL FIELD

This disclosure relates generally to the technical field of integrated circuits (ICs) and more specifically, to an IC with a through-silicon via (TSV) test circuit and a TSV test method.

BACKGROUND

With increasingly ubiquitous adaptation of IC technology, rapid developments have been achieved in electronic devices such as mobile phones, televisions, tablets and precision instruments. IC technology, however, is now facing severe barriers in terms of component size, function enhancement, cost reduction, etc. Three-dimensional (3D) ICs have been developed in an attempt to break-through these barriers.

3D ICs are based on through-silicon vias (TSVs) which interconnect and integrate multiple vertically-stacked tiers of chips. Compared to long interconnects used in traditional planar ICs, TSVs are much shorter and offer a variety of advantages, including lower latency, lower power consumption, and higher performance, which makes TSV-based 3D ICs attractive for various applications.

However, due to limitations in existing processes and materials, defective or malfunctioning TSVs may be produced during the fabrication and bonding of TSVs, and even one single defective TSV in a 3D IC may render the entire IC not functional. Unfortunately, so far there has been no satisfactory solution that can efficiently diagnose the working condition of TSVs.

It is to be noted that the above information disclosed in this Background section is only for facilitating the understanding of the background of this inventive concept and therefore may contain information that does not form the prior art already known to a person of ordinary skill in the art.

SUMMARY

In view of the limitations of existing technologies described above, this disclosure provides an IC with a through-silicon via (TSV) test circuit and a TSV test method that address at least some of the aforementioned limitations.

One aspect of this inventive concept is directed to an IC with a TSV test circuit. The IC may include a first TSV, a second TSV and a phase detector. A first end of the first TSV may be coupled to a predetermined signal output, and a second end of the first TSV may be coupled to a first end of the second TSV. A second end of the second TSV may be coupled to a first input of the phase detector. A second input of the phase detector may be coupled to the predetermined signal output. The phase detector may be configured to determine a phase difference between a signal at the first input of the phase detector and a signal at the second input of the phase detector. A test result may be determined by comparing the phase difference with a predetermined threshold.

In some embodiments, each of the first and the second TSVs may connect two or more stacked tiers.

In some embodiments, the IC may further include a first selector and a first distributor. The first selector may include a first input, a second input, a control terminal and an output, and the first distributor may include an input, a control terminal, a first output and a second output. The first input of the first selector may be configured to receive a first operational signal to be input to the first TSV, the second input of the first selector may be coupled to the predetermined signal output, the control terminal of the first selector may be configured to receive a first test control signal, and the output of the first selector may be coupled to the first end of the first TSV. The input of the first distributor may be coupled to the second end of the first TSV, the control terminal of the first distributor may be configured to receive the first test control signal, the first output of the first distributor may be coupled to the first end of the second TSV, and the second output of the first distributor may be coupled to an active component associated with the first operational signal.

In some embodiments, the IC may further include a third TSV. A first end of the third TSV may be coupled to the predetermined signal output, and a second end of the third TSV may be coupled to the first end of the second TSV.

In some embodiments, the IC may further include a second selector and a second distributor. The second selector may include a first input, a second input, a control terminal and an output, and the second distributor may include an input, a control terminal, a first output and a second output. The first input of the second selector may be configured to receive a second operational signal to be input to the third TSV, the second input of the second selector may be coupled to the predetermined signal output, the control terminal of the second selector may be configured to receive a second test control signal, and the output of the second selector may be coupled to the first end of the third TSV. The input of the second distributor may be coupled to the second end of the third TSV, the control terminal of the second distributor may be configured to receive the second test control signal, the first output of the second distributor may be coupled to the first end of the second TSV, and the second output of the second distributor may be coupled to an active component associated with the second operational signal.

In some embodiments, the IC may further include a third selector and a fourth selector. Each of the third and the fourth selectors may include a first input, a second input, a control terminal and an output. The first input of the third selector may be coupled to the output of the first selector, the second input of the third selector may be coupled to the output of the second selector, the control terminal of the third selector may be configured to receive a third test control signal, and the output of the third selector may be coupled to the second input of the phase detector. The first input of the fourth selector may be coupled to the first output of the first distributor, the second input of the fourth selector may be coupled to the first output of the second distributor, the control terminal of the fourth selector may be configured to receive a fourth test control signal, and the output of the fourth selector may be coupled to the first end of the second TSV.

In some embodiments, the IC may further include one or more additional TSVs. Each of the one or more additional TSVs may have a first end coupled to the predetermined signal output and a second end coupled to the first end of the second TSV.

In some embodiments, a stacked tier associated with the second end of the first TSV may include a delay-locked loop, which may be configured to apply a delay compensation to an operational signal output from the second end of the first TSV based on the phase difference output from the phase detector.

In some embodiments, a stacked tier associated with the second end of the first TSV may include a phase calibrator, which may be configured to apply a delay compensation to an operational signal output from the second end of the first TSV based on the phase difference output from the phase detector.

A second aspect of this inventive concept is directed to a TSV test method. The method may include inputting a predefined signal to a phase detector, the predefined signal being a first signal, inputting the predefined signal, as an input signal of a first TSV, to the first TSV, inputting, via a second TSV, an output signal from the first TSV to the phase detector, the output signal from the first TSV being a second signal; and determining, by the phase detector, a phase difference between the first signal and the second signal. The test result may be determined by comparing the phase difference with a predetermined threshold.

In some embodiments, the inputting the predefined signal to a first TSV may include: in response to a first test control signal, inputting the predefined signal to the first TSV. The inputting an output signal from the first TSV to the phase detector via a second TSV may include: in response to the first test control signal, inputting the output signal from the first TSV to the phase detector via the second TSV.

In some embodiments, the TSV test method may further include: inputting the predefined signal to a third TSV, inputting, via the second TSV, an output signal from the third TSV to the phase detector, the output signal from the third TSV being a third signal; and determining, by the phase detector, a phase difference between the first signal and the third signal.

In some embodiments, the inputting the predefined signal to a third TSV may include: in response to a second test control signal, inputting the predefined signal to the third TSV. The inputting, via the second TSV, an output signal from the third TSV to the phase detector may include: in response to the second test control signal and via the second TSV, inputting the output signal from the third TSV to the phase detector.

In some embodiments, the TSV test method may further include: in response to the input signal of the first TSV being an operational signal, transmitting the phase difference between the first signal and the second signal to a delay-locked loop in a stacked tier associated with a second end of the first TSV, and the delay-locked loop applying a delay compensation to the operational signal.

In some embodiments, the TSV test method may further include: in response to the input signal of the first TSV being an operational signal, transmitting the phase difference between the first signal and the second signal to a phase calibrator in a stacked tier associated with a second end of the first TSV, and the phase calibrator applying a delay compensation to the operational signal.

In some embodiments of this inventive concept, an IC with a TSV test circuit may include a first TSV and a second TSV. A first end of the first TSV may be coupled to a predetermined signal output, and a second end of the first TSV may be coupled to a first end of the second TSV. The IC may further include a phase detector. A first input of the phase detector may be coupled to a second end of the second TSV, a second input of the phase detector may be coupled to the predetermined signal output, and an output of the phase detector may be configured to output a phase difference between a signal at the first input of the phase detector and a signal at the second input of the phase detector. The TSV test circuit of this inventive concept may determine a working condition of a TSV based on a phase difference between a predefined signal directly provided to the phase detector and the predefined signal that was provided to the phase detector through a TSV. A defective TSV, if there is any, may be segregated and substituted with a redundant TSV (e.g., a spare TSV in the IC). Alternatively, an instruction may be issued to a delay-locked loop or a phase calibrator in an associated stacked tier to provide a delay compensation to a signal being transferred through the defective TSV. Thus, signal deviations caused by the defective TSV may be properly compensated, which facilitates efficient fault correction and signal routing in the IC chip.

It is to be understood that both the foregoing general description and the following detailed description are exemplary and explanatory only and are not restrictive of this inventive concept.

BRIEF DESCRIPTION OF THE DRAWINGS

The accompanying drawings, which are incorporated in and constitute a part of the description, illustrate embodiments consistent with this inventive concept and, together with the description, serve to explain the disclosed principles. It is apparent that these drawings present only some embodiments of this inventive concept and those of ordinary skill in the art may obtain drawings of other embodiments from them without exerting any creative effort.

DETAILED DESCRIPTION OF THE EMBODIMENTS

Figure 1:
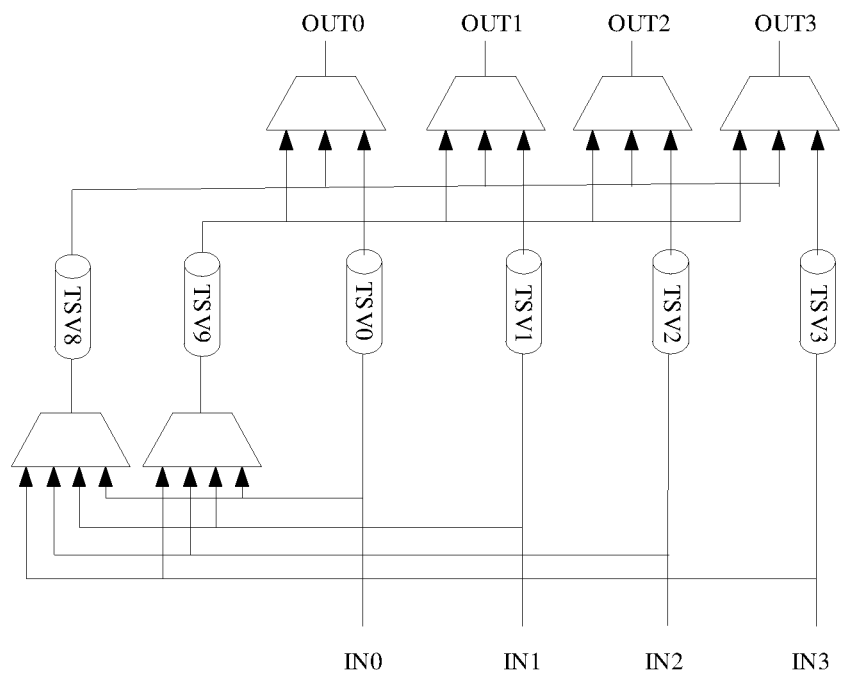
FIG. 1 is a schematic diagram illustrating a TSV fault-tolerant circuit according to some techniques.

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of this inventive concept and to fully convey the concepts of the embodiments to others skilled in the art. In addition, the described features, structures, and characteristics may be combined in any suitable manner in one or more embodiments. In view of the inventive concept herein, those skilled in the art will recognize that various embodiments can be practiced without one or more of the specific details or with other methods, components, materials, or the like. In some instances, well-known structures, materials, or operations are not shown or not described in details to avoid obscuring aspects of the embodiments.

Further, the drawings are presented to illustrate and exemplify the inventive concept and not necessarily drawn to scale. In the drawings, like reference numerals indicate the same or analogous elements, and duplicate detailed description thereof will thus be omitted. It is to be understood that, as used herein, the terms "first", "second", "third", "fourth" and the like are used solely for distinguishing rather than limiting this inventive concept in any sense.

FIG. 1 is a schematic diagram illustrating a TSV fault-tolerant circuit according to some techniques. In the circuit shown in FIG. 1, in case any of TSVs TSV0-TSV3 fails, the failed TSV may be replaced by one of spare TSVs TSV8 or TSV9. However, efficiently detecting a working condition of a TSV remains a challenge task. Some existing techniques focus on structural diagnosis of the TSV, which, however, tends to be complex and costly. In this application, "a working condition" of a TSV may refer to whether a TSV is in a normal condition (works as designed) or defective (works abnormally).

In view of the aforementioned limitations, this inventive concept first provides an IC with a TSV test circuit.

An IC with a TSV test circuit in accordance with a first embodiment of this inventive concept may include a first TSV and a second TSV. Each of the first and the second TSVs may have a first end and a second end. In some embodiments, each of the first and the second TSVs may be an active TSV for transferring a signal from one tier to another when working normally. In some embodiments, the first TSV may be an active TSV, while the second TSV may be a redundant TSV reserved as a spare TSV, therefore no signal is routed through the second TSV during normal operation of the IC.

In the following description, unless otherwise indicated, the second TSV is assumed to be a normally-operating TSV and the first TSV is a TSV of interest whose working condition is to be tested.

The first TSV may have a first end coupled to a predetermined signal output to receive a predefined signal. The predefined signal may be a known signal. For example, the predefined signal may be a rectangular wave signal with predetermined cycle time and amplitude. The particular waveform of the predefined signal, however, is not limited, it may be any other suitable test signal such as a sinusoidal signal, and this inventive concept is not limited herein. The first TSV may also have a second end coupled to a first end of the second TSV.

In some embodiments, the TSV test circuit may include a phase detector (PD) comprising a first input, a second input, and an output. The PD may be configured to determine a phase difference between a signal at the first input to the phase detector and a signal at the second input.

The first input of the phase detector may be coupled to a second end of the second TSV, and the second input of the phase detector may be coupled to the predetermined signal output. The output of the phase detector may be configured to output a phase difference between a signal at the first input and a signal at the second input.

Figure 2:
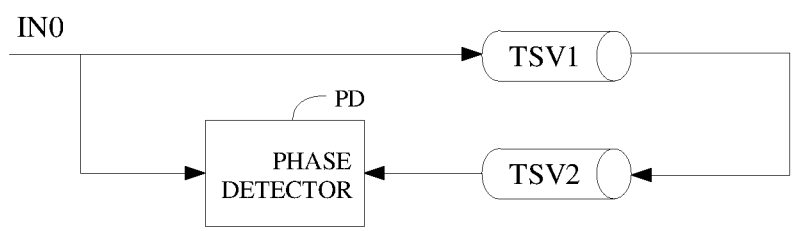
FIG. 2 is a schematic diagram illustrating an IC with a TSV test circuit in accordance with a first embodiment of this inventive concept.

FIG. 2 is a schematic diagram illustrating an IC with a TSV test circuit in accordance with a first embodiment of this inventive concept. The IC will be described in greater detail below with reference to FIG. 2.

Referring to FIG. 2, the first end of the first TSV TSV1 may be coupled to a predetermined signal output (not shown) that provides a predefined signal IN0, to be able to receive the predefined signal IN0. The second end of the first TSV TSV1 may be coupled to the first end of the second TSV TSV2 so that the predefined signal IN0 may be transferred from the first TSV TSV1 to the first end of the second TSV TSV2.

The predefined signal IN0 may be fed to the first input of the phase detector PD via the second TSV TSV2. The predefined signal IN0 may also be provided to the second input of the phase detector PD. Subsequently, the phase detector PD may determine a phase difference between the signals at the first and the second inputs and output this phase difference at the output of the phase detector PD.

In some embodiments, if the phase difference determined by the phase detector PD is greater than a threshold, then it may be determined that the first TSV is abnormal. The threshold may be determined based on the working environment in which the IC is used, and is not limited herein. If the first TSV is determined to be abnormal, some remedial measures may be taken to remedy or avoid possible adverse consequences of the abnormality. These measures may include, for example, providing phase compensation or substituting the abnormal first TSV with a normal TSV.

With this TSV test circuit of this inventive concept, a defective TSV can be identified and then segregated and substituted with a redundant TSV (e.g., a spare TSV in an IC). Alternatively, an instruction may be issued to a delay-locked loop (DLL) or a phase calibrator in an associated stacked tier so as to provide a delay compensation to a signal being transferred through the defective TSV. Thus, signal deviations caused by the defective TSV may be properly compensated, which facilitates efficient fault correction and signal routing in the IC. In this application, an "associated" stacker tier of a component may refer to a stacker tier in which the component is located.

As can be appreciated, the circuit according to the embodiment of FIG. 2 may represent a test scenario. That is, other than a test signal, there is no actual operational signal going through the first TSV in the circuit of FIG. 2. In accordance with a second embodiment of this inventive concept, a circuit that work during actual operation will be described with reference to FIG. 3. Similar to the embodiment disclosed for FIG. 2, in the second embodiment, the second TSV TSV2 is assumed to be a normally-operating TSV and the first TSV TSV1 is a TSV of interest whose working condition is to be tested.

Figure 3:
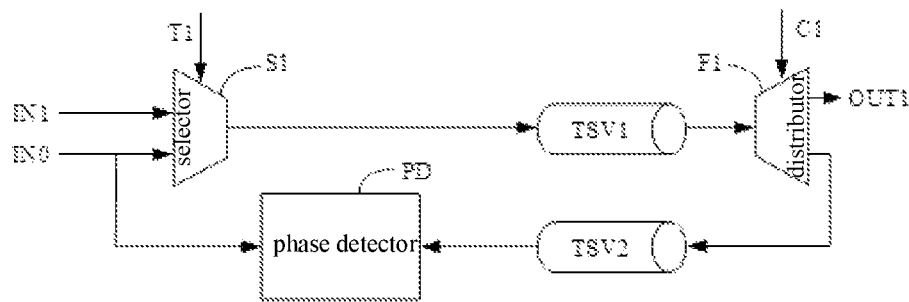
FIG. 3 is a schematic diagram illustrating an IC with a TSV test circuit in accordance with a second embodiment of this inventive concept.

As shown in FIG. 3, compared to the circuit of FIG. 2, in addition to the first TSV TSV1, the second TSV TSV2 and the phase detector PD, the circuit of FIG. 3 may further include a first selector S1 and a first distributor F1. The first selector S1 may have a first input, a second input, a control terminal and an output. The first distributor F1 may have an input, a control terminal, a first output and a second output.

The first input of the first selector S1 may be configured to receive a first operational signal IN1 to be input to the first TSV TSV1. The second input of the first selector S1 may be coupled to the predetermined signal output and configured to receive the predefined signal IN0. The control terminal of the first selector S1 may be configured to receive a first test control signal T1, which may be output by a control circuit (not shown) based on a test task. The output of the first selector S1 may be coupled to the first end of the first TSV TSV1.

The input of the first distributor F1 may be coupled to the second end of the first TSV TSV1. The control terminal of the first distributor F1 may be configured to receive a control signal C1 for acting on the first distributor F1. In some embodiments, the control signal C1 may be implemented as the aforementioned first test control signal T1. The first output of the first distributor F1 may be coupled to the first end of the second TSV TSV2. The second output of the first distributor F1 may be coupled to an active component associated with the first operational signal IN1 so as to provide the active component with an output signal OUT1. The active component may be implemented as, for example, a memory bank or a logic component capable of processing a signal, disposed in an associated stacked tier.

As shown in FIG. 3, the first test control signal T1 may cause the control circuit to operate in a test mode or in a normal mode. In the test mode, the first selector S1 may output the predefined signal IN0 to the first TSV TSV1 under the control of the first test control signal T1. Under this circumstance, the control signal C1 acting on the first distributor F1 may be identical to the first test control signal T1 for the first selector S1, so that an output signal from the first TSV TSV1 may be provided to the second TSV TSV2 and the phase detector PD may then determine a phase difference between the predefined signal IN0 and an output signal from the second TSV TSV2.

In the normal mode, the first selector S1 may output the first operational signal IN1 to the first TSV TSV1 under the control of the first test control signal T1. Under this circumstance, the first distributor F1 may, under the control of the control signal C1, pass the first operational signal IN1 that has transmitted through the first TSV TSV1 on to the associated active component.

In the circuit of FIG. 3, the switch between the test mode and the normal mode may be controlled by the control signal.

Figure 4:
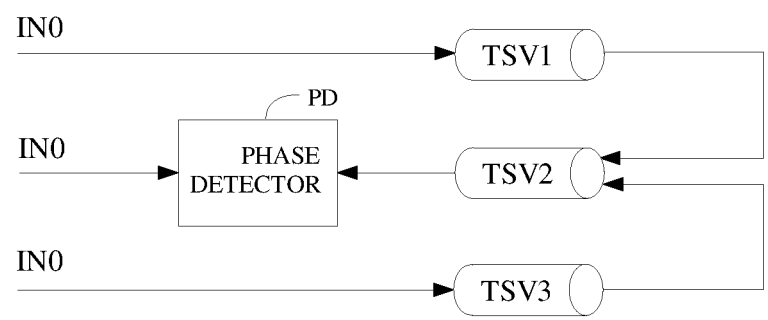
FIG. 4 is a schematic diagram illustrating an IC with a TSV test circuit in accordance with a third embodiment of this inventive concept.

FIG. 4 is a schematic diagram illustrating an IC with a TSV test circuit in accordance with a third embodiment of this inventive concept. The IC of FIG. 4 may, in addition to the IC of FIG. 2, further include a third TSV TSV3. A first end of the third TSV TSV3 may be coupled to the predetermined signal output and a second end of the third TSV TSV3 may be coupled to the first end of the second TSV TSV2. Similarly to that in the aforementioned embodiments, in this embodiment, the second TSV TSV2 may be assumed as a normally-operating TSV and the first TSV TSV1 and the third TSV TSV3 are TSVs of interest whose working condition are to be tested.

Since both the first TSV TSV1 and the third TSV TSV3 are present in the circuit, a signal control component may be utilized to determine a transmission route for the predefined signal. As shown in FIG. 4, to test the first TSV TSV1, the predefined signal IN0, under the control of the signal control component (not shown), may go through the first TSV TSV1, rather than the third TSV TSV3, before reaching the phase detector PD. To test the third TSV TSV3, the predefined signal IN0, under the control of the signal control component (not shown), may go through the third TSV TSV3, rather than the first TSV TSV1, before reaching the phase detector PD. Thus, different TSVs may be selected for test according to different needs.

Figure 5:
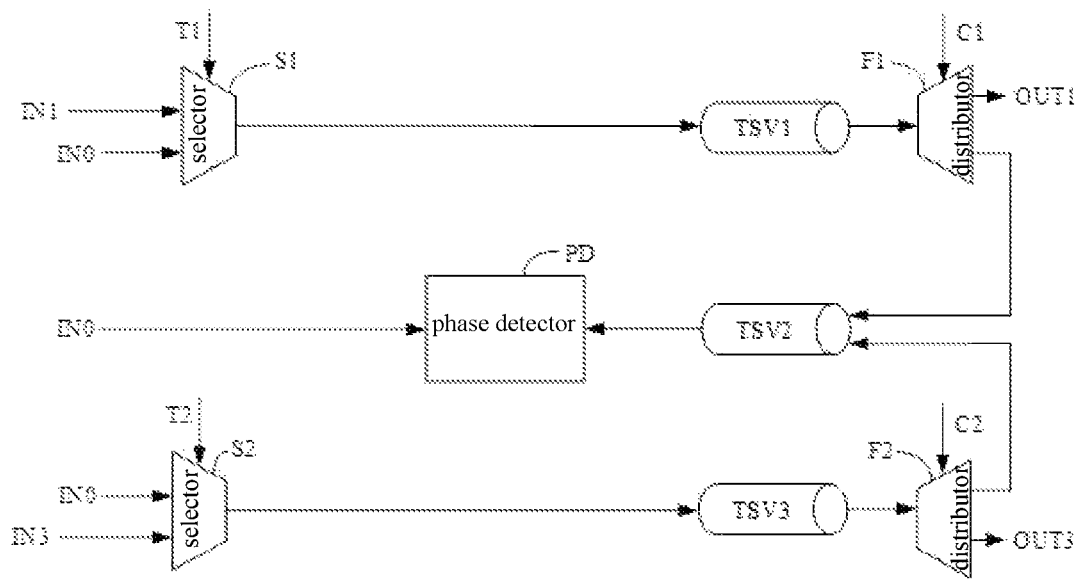
FIG. 5 is a schematic diagram illustrating an IC with a TSV test circuit in accordance with a fourth embodiment of this inventive concept.

FIG. 5 is a schematic diagram illustrating an IC with a TSV test circuit in accordance with a fourth embodiment of this inventive concept. The IC of FIG. 5 may, in addition to the IC of FIG. 3, further include a second selector S2 and a second distributor F2. The second selector S2 may have a first input, a second input, a control terminal and an output. The second distributor F2 may have an input, a control terminal, a first output and a second output. Similarly, in this embodiment, the second TSV TSV2 may be assumed as a normally-operating TSV.

Referring to FIG. 5, the first input of the second selector S2 may be configured to receive a second operational signal IN3 to be input to the third TSV TSV3. The second input of the second selector S2 may be coupled to the predetermined signal output. The control terminal of the second selector S2 may be configured to receive a second test control signal T2, and the output of the second selector S2 may be coupled to the first end of the third TSV TSV3.

The input of the second distributor F2 may be coupled to the second end of the third TSV TSV3. The control terminal of the second distributor F2 may be configured to receive the second test control signal C2. The first output of the second distributor F2 may be coupled to the first end of the second TSV TSV2. The second output of the second distributor F2 may be coupled to an active component associated with the second operational signal IN3.

Similar to the embodiment shown in FIG. 4, the TSV test circuit of FIG. 5 also allows the determination of a transmission route for the predefined signal by using a signal control element, and relevant parts in the aforementioned embodiments may be referred to for details, which will not be repeatedly described herein.

Figure 6:
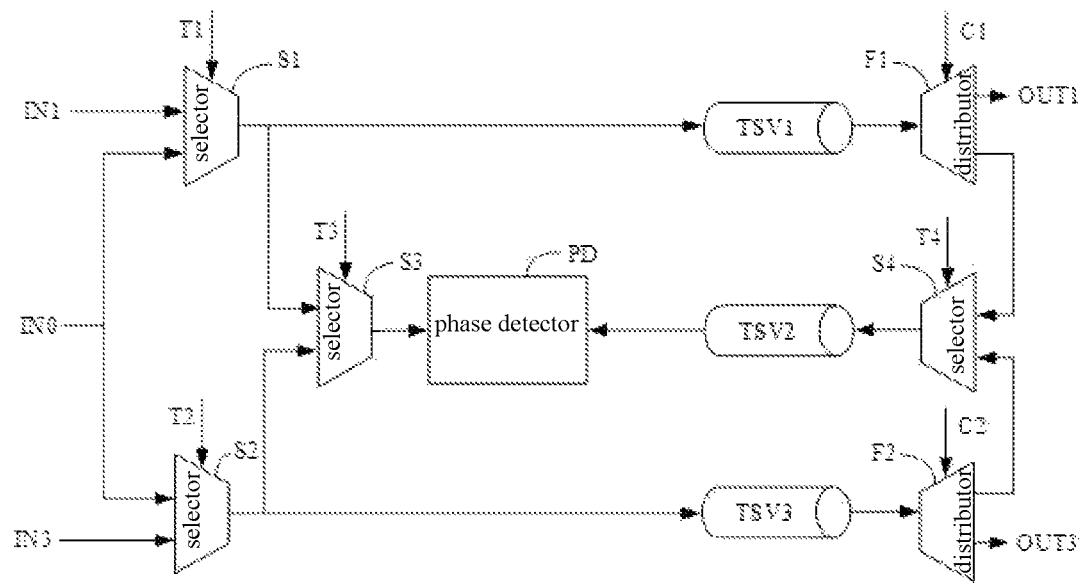
FIG. 6 is a schematic diagram illustrating an IC with a TSV test circuit in accordance with a fifth embodiment of this inventive concept.

FIG. 6 is a schematic diagram illustrating an IC with a TSV test circuit in accordance with a fifth embodiment of this inventive concept. Referring to FIG. 6, the IC may include the first TSV TSV1, the second TSV TSV2, and the third TSV TSV3 as described in the aforementioned embodiments. Connections of the second TSV TSV2 to the first TSV TSV1 and the third TSV TSV3 may be controlled using a control element. Similar to other embodiments, in this embodiment, the second TSV TSV2 may be assumed as a normally-operating TSV.

Referring to FIG. 6, the IC may further include a third selector S3 and a fourth selector S4. Each of the third selector S3 and the fourth selector S4 may have a first input, a second input, a control terminal and an output.

The IC in accordance with the fifth embodiment of this inventive concept will be described in detail below with reference to FIG. 6.

The first input of the third selector S3 may be coupled to the output of the first selector S1. The second input of the third selector S3 may be coupled to the output of the second selector S2. The output of the third selector S3 may be coupled to the second input of the phase detector PD. The control terminal of the third selector S3 may be configured to receive a third test control signal T3 indicating which of the first TSV TSV1 and the third TSV TSV3 is to be tested.

The first input of the fourth selector S4 may be coupled to the first output of the first distributor F1. The second input of the fourth selector S4 may be coupled to the first output of the second distributor F2. The output of the fourth selector S4 may be coupled to the first end of the second TSV TSV2. The control terminal of the fourth selector S4 may be configured to receive a fourth test control signal T4 indicating which of the first TSV TSV1 and the third TSV TSV3 is to be tested.

It is to be understood that, in the IC of FIG. 6, only one of the TSVs is tested at a single time. In other words, in some scenarios, with the first selector S1 sending the predefined signal IN0 to the first TSV TSV1, the second selector S2 will be sending the third operational signal IN3 to the third TSV TSV3. In other scenarios, with the first selector S1 sending the first operational signal IN1 to the first TSV TSV1, the second selector S2 will be sending the predefined signal IN0 to the third TSV TSV3.

In addition, depending on whether the first TSV TSV1 or the third TSV TSV3 is to be tested, there may exist correspondence relationships among the control signal T1 the first selector S1 received, the control signal C1 the first distributor F1 received, the control signal T2 the second selector S2 received, the control signal C2 the second distributor F2 received, the control signal T3 the third selector S3 received, and the control signal T4 the fourth selector S4 received.

In one example, the first TSV TSV1 is tested, the first selector S1 may output the predefined signal IN0 under the control of the control signal T1. The first distributor F1 may input, under the control of the control signal C1, to the fourth selector S4, the predefined signal IN0 that has travelled through the first TSV TSV1. Additionally, the second selector S2 may output the third operational signal IN3 to the third TSV TSV3 under the control of the control signal T2. The second distributor F2 may output the third operational signal IN3 that has propagated through the third TSV TSV3, indicated as OUT3, under the control of the control signal C2. Further, the third selector S3 may feed the predefined signal IN0 output from the first selector S1 to the phase detector PD under the control of the control signal T3. The fourth selector S4 may transmit, under the control of the control signal T4, the signal from the first distributor F1 to the second TSV TSV2 and further to the phase detector PD.

In another example, the third TSV TSV3 is tested, the first selector S1 may output the first operational signal IN1 under the control of the control signal T1. The first distributor F1 may output the first operational signal IN1 that has propagated through the first TSV TSV1, indicated as OUT1, under the control of the control signal C1. Additionally, the second selector S2 may output the predefined signal IN0 under the control signal T2. The second distributor F2 may input, under the control of the control signal C2, to the fourth selector S4, the predefined signal IN0 that has travelled through the third TSV TSV3. Further, the third selector S3 may send the predefined signal IN0 output from the second selector S2 to the phase detector PD under the control of the control signal T3. The fourth selector S4 may transmit, under the control of the control signal T4, the signal from the second distributor F2 to the second TSV TSV2 and further to the phase detector PD.

In the embodiment of FIG. 6, in addition to the first TSV TSV1 and the second TSV TSV2, the IC may further include the third TSV TSV3. It will be readily appreciated that, in other embodiments, the IC may further include one or more additional TSVs in addition to the first, the second and the third TSVs described above. Each of the one or more additional TSVs may have a first end coupled to the predetermined signal output and a second end coupled to the first end of the second TSV. The IC may further include additional multiple selectors and distributors to perform similar control to determine which one of these TSVs is to be tested. Those skilled in the art may obtain embodiments, in which multiple TSVs to be tested can be determined, in light of the teachings disclosed above, and relevant parts in the aforementioned embodiments may be referred to for details, which will not be repeatedly described herein.

It is to be noted that in the foregoing embodiments, the second TSV TSV2 is assumed as a normal, non-defective TSV. However, according to the concepts of this invention, even if the second TSV is defective, it is still possible to determine whether the first TSV TSV1 or the third TSV TSV3 is defective. For example, if it has been determined that the first TSV TSV1 is a normally-operating TSV, then the first TSV TSV1 may be coupled to the phase detector PD at one end and to the signal-outputting end of the third TSV TSV3 at the other end. With this design, it is possible to verify whether the third TSV TSV3 is normal or not. If it has been determined that the third TSV TSV3 is a normally-operating TSV, then the third TSV TSV3 may be coupled to the phase detector PD at one end and to the signal-outputting end of the first TSV TSV1 at the other end. Thus, it is possible to verify whether the first TSV TSV1 is normal or not. In these cases, the components can be connected in a similar manner as described above, relevant parts in the aforementioned embodiments may be referred to for details, which will not be repeatedly described herein.

In some embodiments, after the phase detector has determined the phase difference between the signal at its first input and the signal at its second input, it may output this phase difference.

Figure 7:
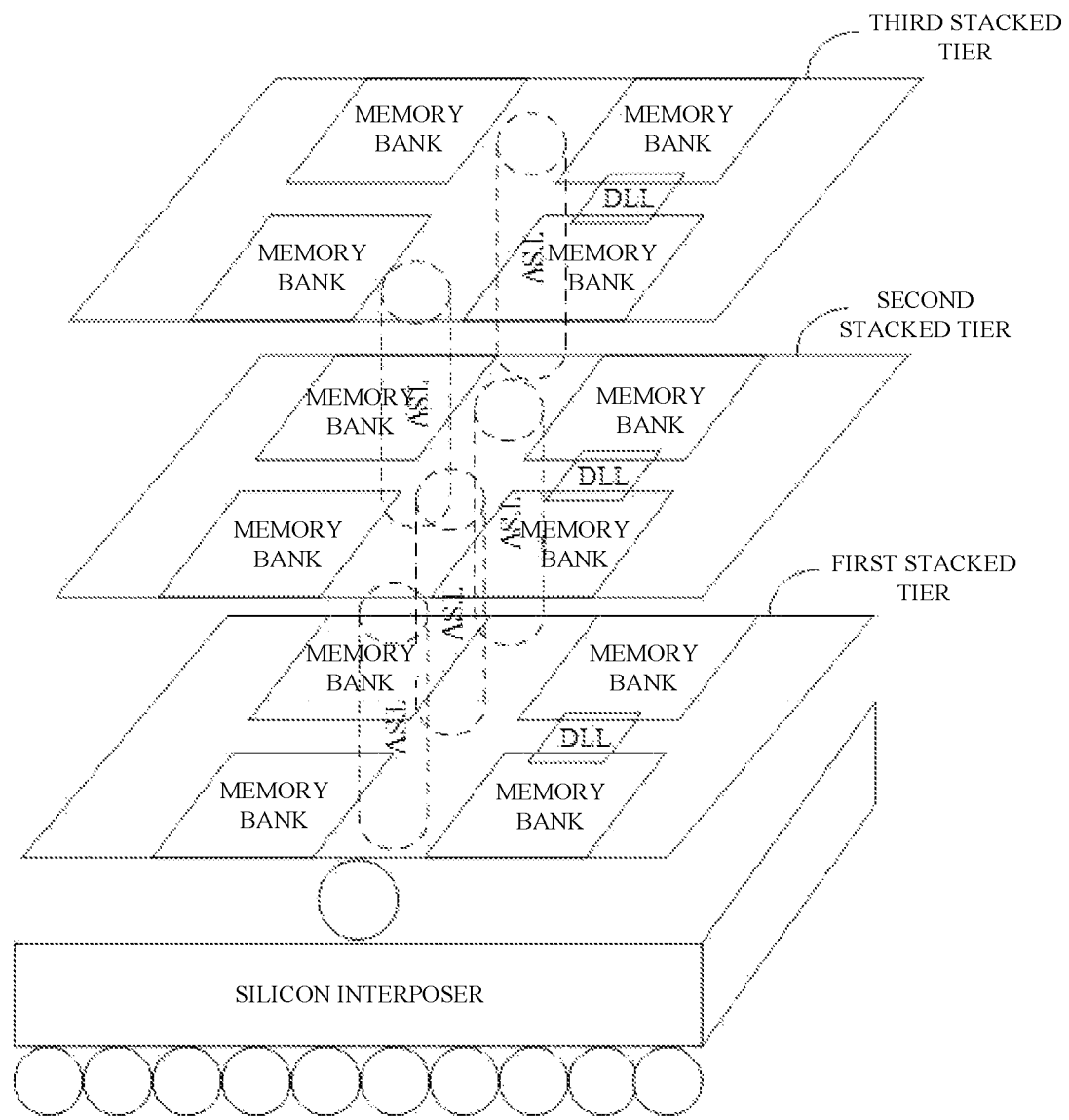
FIG. 7 is a schematic diagram illustrating an application of a phase compensation to an identified abnormal TSV by a delay-locked loop (DLL) in accordance with an embodiment of this inventive concept.

FIG. 7 is a schematic diagram illustrating an application of a phase compensation to an identified abnormal TSV by a delay-locked loop (DLL) in accordance with an embodiment of this inventive concept. FIG. 7 shows an exemplary use of the determined phase difference. Referring to FIG. 7, the IC may include a silicon interposer, a first stacked tier, a second stacked tier and a third stacked tier. Each of the stacked tiers may include a number of (e.g., four) memory banks. For example, each of the four memory banks in the first stacked tier may have a storage capacity of 2 Gb, summing up to a total of 8 Gb.

Each two of the first, the second and the third stacked tiers may communicate information with each other via TSVs. In one example, TSVs may communicate information between the first and the second stacked tiers. After the phase detector (not shown in FIG. 7) has determined the phase difference, a DLL arranged in the second stacked tier may, based on the phase difference, apply a delay compensation to every signal to be routed to the second stacked tier. For example, the DLL may be configured to apply a delay compensation to an operational signal output from the second end of the first TSV, based on the phase difference output from the phase detector.

In addition, phase detectors in the IC may pass phase differences they determined to the silicon interposer, which may, based on a predetermined logic, perform centralized and comprehensive processing of the phase differences, and transmit control signal based on the processed phase differences to the stacked tiers. Under the control of these control signals, DLLs in the stacked tiers may apply a delay compensation to signals bound to the individual tiers.

Further, instead of the DLLs, phase calibrators may also be utilized to apply a delay compensation to signals to be received by the individual stacked tiers. For example, the phase calibrator may be configured to, based on the phase difference output from the phase detector, apply a delay compensation to an operational signal output from the second end of the first TSV. The delay compensation may be accomplished in a manner described in the aforementioned embodiment or in any other manner known to persons of ordinary skills in the art. Therefore details of the delay compensation will not be described herein.

With the IC of this inventive concept, a defective TSV can be identified, segregated and substituted with a redundant TSV such as a spare TSV. Alternatively, an instruction may be issued to a DLL or a phase calibrator in an associated stacked tier to effect a delay compensation of a signal being transferred in the defective TSV. Thus, signals can be routed correctly and efficiently in the IC. This IC is capable of effectively avoiding performance degradation or failure due to signal delays.

This inventive concept further provides a TSV test method, which may be used with the IC with the TSV test circuit in accordance with any of the aforementioned embodiments.

Figure 8:
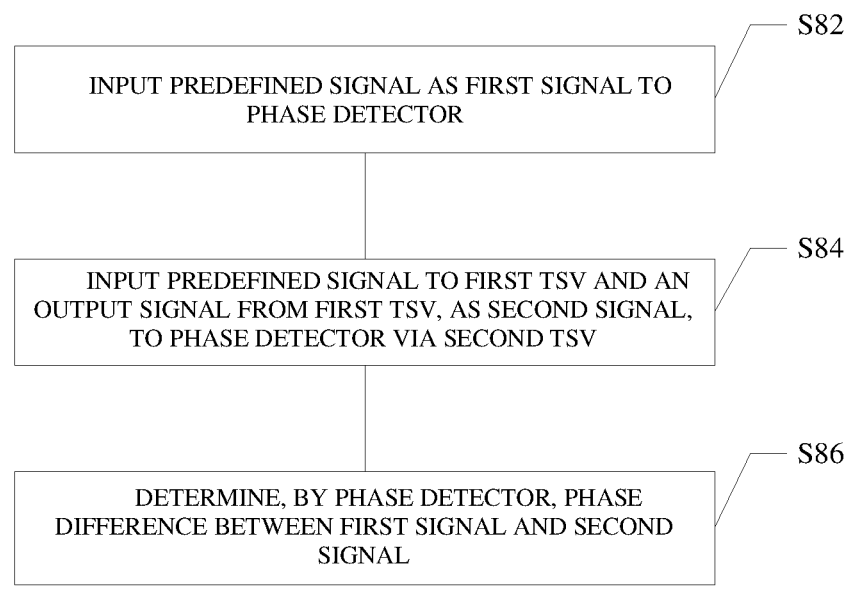
FIG. 8 is a schematic flowchart illustrating a TSV test method in accordance with an embodiment of this inventive concept.

FIG. 8 is a schematic flowchart illustrating a TSV test method in accordance with an embodiment of this inventive concept. Referring to FIG. 8, the TSV test method may include the following steps S82 through S86.

In step S82, a predefined signal may be input as a first signal to a phase detector.

In some embodiments, the predefined signal may be a known signal for testing a TSV, and the phase detector may be configured to determine a phase difference between signals.

In step S84, the predefined signal may be input to a first TSV, and an output signal from the first TSV may be input as a second signal to the phase detector via a second TSV.

In some embodiments, the first TSV may be a TSV to be tested, and the second TSV may have been determined as a normally-operating TSV. The predefined signal may propagate successively through the first TSV and the second TSV and then reach the phase detector.

In step S86, a phase difference between the first signal and the second signal may be determined by the phase detector.

If the first TSV is determined, by the phase detector, as a defective TSV based on the phase difference between the first signal and the second signal, it may be segregated and substituted with a redundant TSV such as a spare TSV.

In some embodiments, the predefined signal may be input to the first TSV in response to a first test control signal, and the output signal from the first TSV may be input, in response to the first test control signal, as the second signal to the phase detector via the second TSV. The IC described above with reference to FIG. 3 may be referred to for details in this regard, so another description thereof is not necessary.

In some embodiments, the TSV test method may further include: inputting the predefined signal to a third TSV and an output signal from the third TSV as a third signal to the phase detector via the second TSV; and determining a phase difference between the first signal and the third signal by the phase detector.

In some embodiments, the predefined signal may be input to the third TSV in response to a second test control signal, and the output signal from the third TSV may be input, in response to the second test control signal, as the third signal to the phase detector via the second TSV. The ICs described above with reference to FIGS. 4 to 6 may be referred to for details in this regard, so another description thereof is not necessary.

In some embodiments, the TSV test method may further include: when the signal input to the first TSV is an operational signal, transmitting the phase difference between the first and the second signals to a DLL in a stacked tier associated with a second end of the first TSV; and applying a delay compensation to the operational signal by the DLL.

In this application, a stacker tier "associated with" an end of a TSV may refer to a stacker tier in which the end of the TSV is located.

In some embodiments, the TSV test method may further include: when the signal input to the first TSV is an operational signal, transmitting the phase difference between the first and the second signals to a phase calibrator in a stacked tier associated with a second end of the first TSV; and applying a delay compensation to the operational signal by the phase calibrator.

With the TSV test methods in accordance with the embodiments of this inventive concept, a defective TSV can be identified, segregated and substituted with a redundant TSV such as a spare TSV. Alternatively, an instruction may be issued to a DLL or a phase calibrator in an associated stacked tier so as to effect a delay compensation of a signal being transferred in the defective TSV. Thus, signals can be routed correctly and efficiently in the IC.

Other features of the TSV test method obtained by those skilled in the art in light of the above description of the IC with the TSV test circuit are intended to be also within the scope of this disclosure.

Other embodiments of this inventive concept will be apparent to those skilled in the art from considering the specification and practicing this inventive concept disclosed herein. Accordingly, this disclosure is intended to cover all and any variations, uses, or adaptations of the inventive concept which follow, in general, the principles thereof and include such departures from this inventive concept come within common knowledge or customary practice within the art to which the inventive concept pertains. It is also intended that the specification and examples be considered as exemplary only, with true scope and spirit of this inventive concept being indicated by the appended claims.

It is to be understood that this inventive concept is not limited to the exact structures as described above and illustrated in the drawings and may be modified or changed without departing from its scope. The scope of this inventive concept is intended to be defined only by the appended claims.

The invention claimed is:

1. An integrated circuit (IC) with a through-silicon via (TSV) test circuit, comprising a first TSV, a second TSV and a phase detector,
    a first end of the first TSV coupled to a predetermined signal output, and a second end of the first TSV coupled to a first end of the second TSV,
    a second end of the second TSV coupled to a first input of the phase detector,
    a second input of the phase detector coupled to the predetermined signal output,
    wherein the phase detector is configured to determine a phase difference between a signal at the first input of the phase detector and a signal at the second input of the phase detector, and wherein a test result is determined by comparing the phase difference with a predetermined threshold,
    wherein a stacked tier associated with the second end of the first TSV comprises a phase calibrator configured to apply a delay compensation to an operational signal output from the second end of the first TSV based on the phase difference output from the phase detector.

2. The IC of claim 1, wherein each of the first and the second TSVs connects two or more stacked tiers.

3. An integrated circuit (IC) with a through-silicon via (TSV) test circuit, comprising a first TSV, a second TSV and a phase detector, a first end of the first TSV coupled to a predetermined signal output, and a second end of the first TSV coupled to a first end of the second TSV, a second end of the second TSV coupled to a first input of the phase detector, a second input of the phase detector coupled to the predetermined signal output, wherein the phase detector is configured to determine a phase difference between a signal at the first input of the phase detector and a signal at the second input of the phase detector, and wherein a test result is determined by comparing the phase difference with a predetermined threshold, a first selector and a first distributor, the first selector comprising a first input, a second input, a control terminal and an output, the first distributor comprising an input, a control terminal, a first output and a second output, the first input of the first selector configured to receive a first operational signal to be input to the first TSV, the second input of the first selector coupled to the predetermined signal output, the control terminal of the first selector configured to receive a first test control signal, the output of the first selector coupled to the first end of the first TSV, the input of the first distributor coupled to the second end of the first TSV, the control terminal of the first distributor configured to receive the first test control signal, the first output of the first distributor coupled to the first end of the second TSV, the second output of the first distributor coupled to an active component associated with the first operational signal.

4. The IC of claim 3, further comprising:
a third TSV, a first end of the third TSV coupled to the predetermined signal output, a second end of the third TSV coupled to the first end of the second TSV.

5. The IC of claim 4, further comprising:
a second selector and a second distributor, the second selector comprising a first input, a second input, a control terminal and an output, the second distributor comprising an input, a control terminal, a first output and a second output, the first input of the second selector configured to receive a second operational signal to be input to the third TSV, the second input of the second selector coupled to the predetermined signal output, the control terminal of the second selector configured to receive a second test control signal, the output of the second selector coupled to the first end of the third TSV, the input of the second distributor coupled to the second end of the third TSV, the control terminal of the second distributor configured to receive the second test control signal, the first output of the second distributor coupled to the first end of the second TSV, the second output of the second distributor coupled to an active component associated with the second operational signal.

6. The IC of claim 5, further comprising:
a third selector and a fourth selector, each of the third and the fourth selectors comprising a first input, a second input, a control terminal and an output, the first input of the third selector coupled to the output of the first selector, the second input of the third selector coupled to the output of the second selector, the control terminal of the third selector configured to receive a third test control signal, the output of the third selector coupled to the second input of the phase detector, the first input of the fourth selector coupled to the first output of the first distributor, the second input of the fourth selector coupled to the first output of the second distributor, the control terminal of the fourth selector configured to receive a fourth test control signal, the output of the fourth selector coupled to the first end of the second TSV.

7. The IC of claim 4, further comprising:
one or more additional TSVs, each of the one or more additional TSVs having a first end coupled to the predetermined signal output and a second end coupled to the first end of the second TSV.

8. The IC of claim 1, wherein the stacked tier associated with the second end of the first TSV comprises a delay-locked loop,
and wherein the delay-locked loop is configured to apply a delay compensation to an operational signal output from the second end of the first TSV based on the phase difference output from the phase detector.

9. A through-silicon via (TSV) test method, comprising:
inputting a predefined signal to a phase detector, the predefined signal being a first signal wherein the phase detector comprises a first input and a second input, and the first signal is input to the second input of the phase detector;

inputting the predefined signal, as an input signal of a first TSV, to the first TSV, wherein the first TSV is the TSV whose working condition to be tested;

inputting, via a second TSV, an output signal from the first TSV to the phase detector, the output signal from the first TSV being a second signal, wherein the second signal is input to the first input of the phase detector;

determining, by the phase detector, a phase difference between the first signal and the second signal;

determining a test result by comparing the phase difference with a predetermined threshold;

transmitting, in response to the input signal of the first TSV being an operational signal, the phase difference between the first signal and the second signal to a phase calibrator in a stacked tier associated with a second end of the first TSV; and applying, by the phase calibrator, a delay compensation to the operational signal.

10. The method of claim 9, wherein the inputting the predefined signal to the first TSV comprises:
inputting, in response to a first test control signal, the predefined signal to the first TSV,
and wherein the inputting, via a second TSV, an output signal from the first TSV to the phase detector comprises:
inputting, in response to the first test control signal and via the second TSV, the output signal from the first TSV to the phase detector.

11. The method of claim 10, further comprising:
inputting the predefined signal to a third TSV;
inputting, via the second TSV, an output signal from the third TSV to the phase detector, the output signal from the third TSV being a third signal; and
determining, by the phase detector, a phase difference between the first signal and the third signal.

12. The method of claim 11, wherein the inputting the predefined signal to a third TSV comprises:
inputting, in response to a second test control signal, the predefined signal to the third TSV, and wherein the inputting, via the second TSV, an output signal from the third TSV to the phase detector comprises:

inputting, in response to the second test control signal and via the second TSV, the output signal from the third TSV to the phase detector.

13. The method of claim 9, further comprising:

transmitting, in response to the input signal of the first TSV being an operational signal, the phase difference between the first signal and the second signal to a delay-locked loop in the stacked tier associated with a second end of the first TSV; and applying, by the delay-locked loop, a delay compensation to the operational signal.

* * * * *